(12) United States Patent
Yano

(10) Patent No.: US 8,814,993 B2
(45) Date of Patent: Aug. 26, 2014

(54) VENT STRUCTURE

(75) Inventor: Youzou Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 111 days.

(21) Appl. No.: 13/639,422

(22) PCT Filed: Jan. 10, 2012

(86) PCT No.: PCT/JP2012/000089
§ 371 (c)(1),
(2), (4) Date: Oct. 4, 2012

(87) PCT Pub. No.: WO2012/157149
PCT Pub. Date: Nov. 22, 2012

(65) Prior Publication Data
US 2013/0055898 A1    Mar. 7, 2013

(30) Foreign Application Priority Data

May 19, 2011  (JP) .................................. 2011-111935

(51) Int. Cl.
*B01D 53/22* (2006.01)
*F21S 8/10* (2006.01)
(52) U.S. Cl.
CPC .................................. *F21S 48/332* (2013.01)
USPC ........................ 96/4; 95/45; 55/385.4; 55/502
(58) Field of Classification Search
USPC .............. 96/4; 95/45; 55/385.2, 385.4, 385.6, 55/502
See application file for complete search history.

(56) References Cited

U.S. PATENT DOCUMENTS

| 4,853,013 | A  | * | 8/1989  | Rio et al. ...................... 55/385.4 |
| 6,214,070 | B1 | * | 4/2001  | Crowder et al. .............. 55/385.6 |
| 6,464,425 | B1 | * | 10/2002 | Closkey ............................... 96/4 |
| 7,166,024 | B2 | * | 1/2007  | Mashiko et al. .............. 55/385.4 |
| 7,396,391 | B2 | * | 7/2008  | Waida ................................... 96/4 |
| 7,678,169 | B1 | * | 3/2010  | Gwin et al. .................... 55/385.4 |
| 8,147,105 | B2 |   | 4/2012  | Ikeno et al. |
| 8,246,726 | B2 |   | 8/2012  | Yano |
| 8,277,295 | B2 | * | 10/2012 | Yano ............................ 55/385.4 |
| 8,414,672 | B2 | * | 4/2013  | Furuyama et al. ........... 55/385.4 |
| 8,475,575 | B2 | * | 7/2013  | Ono et al. ........................... 96/4 |
| 2009/0047890 | A1 |   | 2/2009  | Yano et al. |
| 2011/0016836 | A1 | * | 1/2011  | Yano ............................... 55/491 |

FOREIGN PATENT DOCUMENTS

| JP | 2007-087666 | 4/2007 |
| JP | 2007-141629 | 6/2007 |
| JP | 2010-277842 | 12/2010 |
| WO | 2009/122785 | 10/2009 |
| WO | WO 2009/122785 A1 * 10/2009 ............. B60R 16/02 |

* cited by examiner

*Primary Examiner* — Jason M Greene
(74) *Attorney, Agent, or Firm* — Hamre, Schumann, Mueller & Larson, P.C.

(57) ABSTRACT

A housing (10) is provided with an opening (11) having a tapered surface (12). A vent member (2) to be attached to the opening (11) includes a support body (3) having a vent passage (30), a waterproof gas-permeable membrane (4), and a cover (5). The support body (3) has a base portion (31) to which the waterproof gas-permeable membrane (4) is bonded, and a stem portion (32) extending from the base portion (31) so as to be engaged with an inside surface of the housing (10). The stem portion (32) is fitted with a seal member (6), and this seal member (6) is pressed against the tapered surface (12) in the opening (11) by a pressing portion (34).

6 Claims, 8 Drawing Sheets

PRIOR ART

VENT STRUCTURE

TECHNICAL FIELD

The present invention relates to a vent structure in which a vent member is attached to an opening of a housing.

BACKGROUND ART

Conventionally, for example, in automotive electrical components such as lamps and ECUs (Electrical Control Units) for automobiles, OA (Office Automation) equipment, home electric appliances, medical equipment, etc., an opening is provided in a housing for containing electronic components, a control board, etc. to reduce pressure fluctuation in the housing due to temperature change or to ventilate the housing, and a vent member is attached to this opening. This vent member not only ensures ventilation between the interior and exterior of the housing but also prevents foreign substances such as dust and water from entering the housing.

For example, Patent Literature 1 discloses a vent member 100 as shown in FIG. 8. This vent member 100 includes an overall tubular support body 110 fitted into an opening 151 of a housing 150, a waterproof gas-permeable membrane 120 that closes a vent passage which is the interior space of the support body 110, and a cover 130 that covers the waterproof gas-permeable membrane 120. The support body 110 has a base portion 111 to which the waterproof gas-permeable membrane 120 is bonded and a stem portion 111 extending from the base portion 111 so as to be engaged with the inside surface of the housing 150 through the opening 151. A seal member 140 is fitted to the base of the stem portion 112. This seal member 140 is pressed against the surface of the housing 150 by the base portion 111, and thereby a gap between the support body 110 and the housing 150 is sealed.

CITATION LIST

Patent Literature

Patent Literature 1 JP 2007-141629 A

SUMMARY OF INVENTION

Technical Problem

For example, in the case of automotive electrical components, they may be subjected to a high-pressure water jet when a car is washed with high-pressure water. However, in the vent member 100 as shown in FIG. 8, the seal member 140 is exposed between the surface of the housing 150 and the base portion 111 of the support body 110. Therefore, when the automotive electrical components are subjected to a high-pressure water jet as mentioned above, the seal member 140 is directly exposed to the high-pressure water, which may cause the seal member to deform and the water to enter the interior of the housing.

Under these circumstances, it is an object of the present invention to provide a vent structure capable of preventing direct exposure of a seal member to water, oil, etc. from outside.

Solution to Problem

The present invention provides a vent structure including: a housing provided with an opening having a tapered surface whose diameter increases from an interior space of the housing toward an exterior space thereof; a vent member including a support body fitted into the opening and having a vent passage opening into the internal space, a waterproof gas-permeable membrane that closes the vent passage, and a cover that covers the waterproof gas-permeable membrane; and a seal member that seals a gap between the housing and the support body around the vent passage. In this vent structure, the support body is provided with a through-hole constituting the vent passage, and has: a base portion to which the waterproof gas-permeable membrane is bonded; a tubular stem portion fitted with the seal member and extending from the base portion so as to be engaged with an inside surface of the housing; and a pressing portion that presses the seal member against the tapered surface in the opening.

Advantageous Effects of Invention

With the above configuration, the seal member is disposed inside the opening, which makes it possible to prevent direct exposure of the seal member to water, oil, etc. from outside.

DESCRIPTION OF EMBODIMENTS

Hereinafter, embodiments of the present invention will be described with reference to the accompanying drawings. The following description relates to examples of the present invention, and the present invention is not limited by these examples.

First Embodiment

Figure 1:
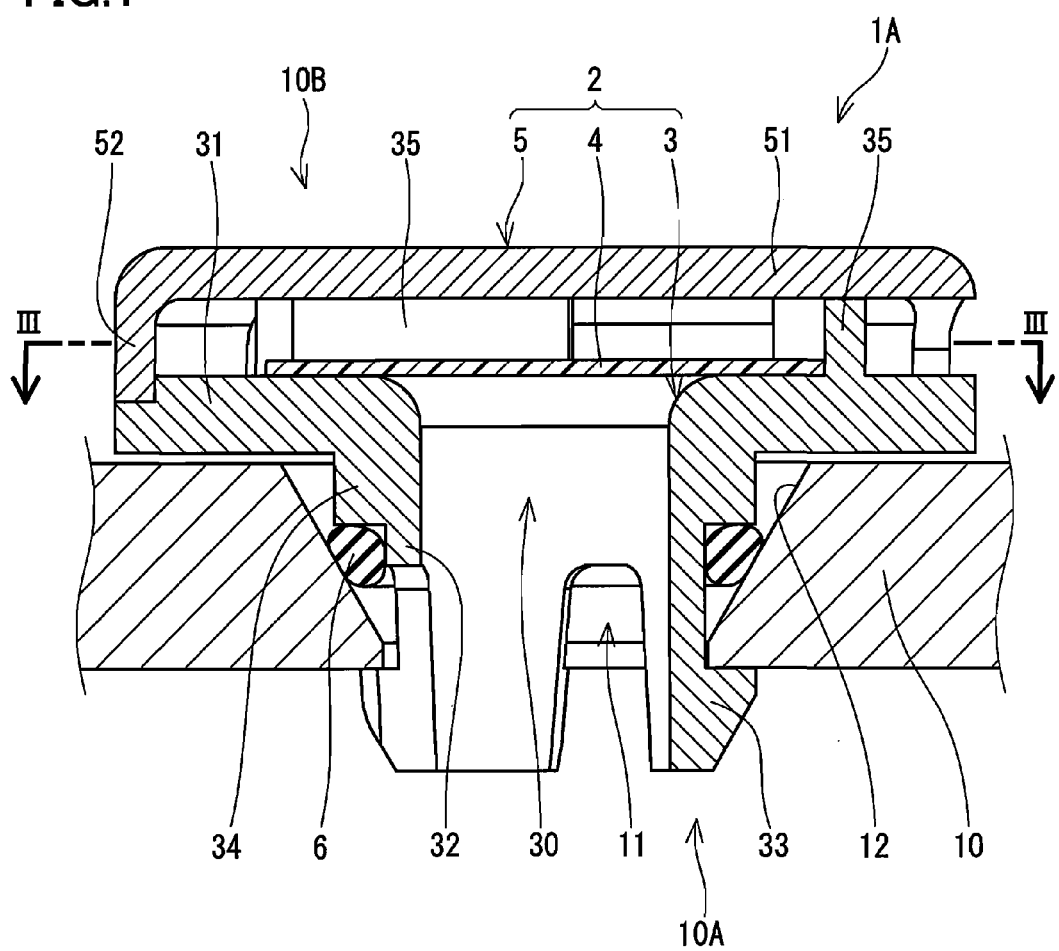
FIG. 1 is a longitudinal sectional view of a vent structure according to a first embodiment of the present invention.
Figure 2:
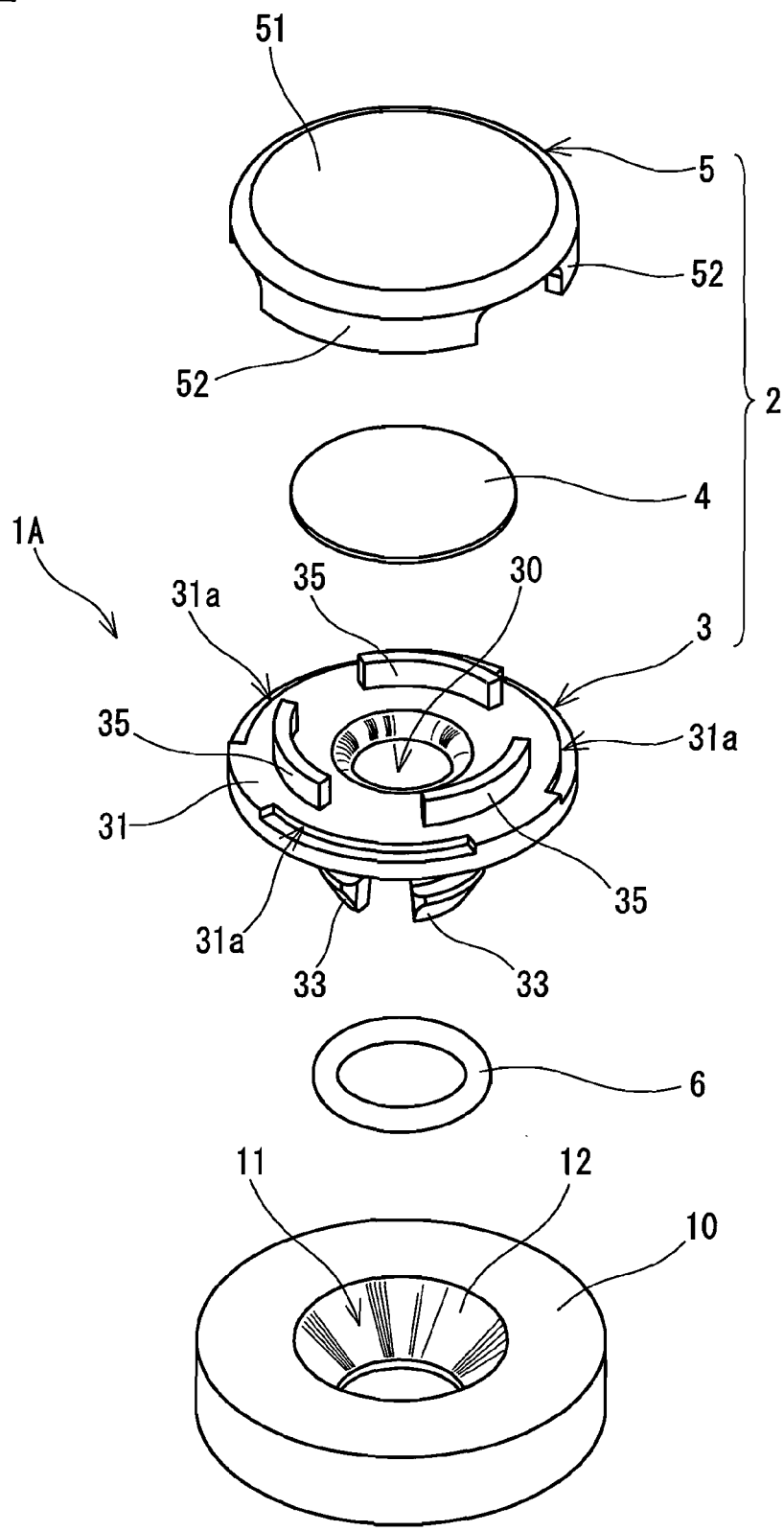
FIG. 2 is an exploded perspective view of the vent structure shown in FIG. 1.
Figure 3:
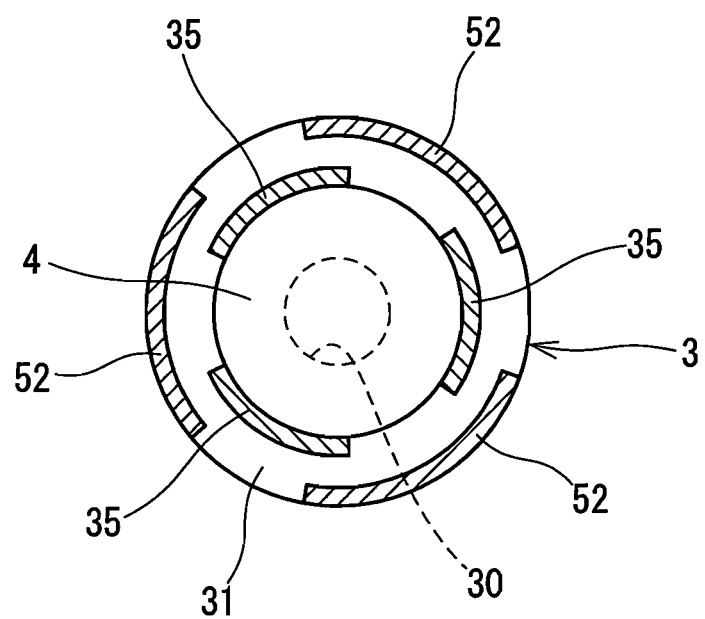
FIG. 3 is a transverse sectional view taken along the line of FIG. 1.

FIGS. 1 to 3 show a vent structure 1A according to the first embodiment of the present invention. This vent structure 1A includes a housing 10 provided with an opening 11, a vent member 2 attached to the opening 11, and a seal member 6 held by the vent member 2.

The opening 11 has, in at least a part thereof in the axial direction, a tapered surface 12 whose diameter increases from an interior space 10A of the housing 10 toward an exterior space 10B thereof. In the present embodiment, only a small part on the interior space 10A side of the inner peripheral surface of the opening 11 is cylindrical in shape, and almost all of the rest is tapered. That is, the tapered surface 12 is connected to the surface of the housing 10. The direction in which the opening 11 opens is not particularly limited. The opening 11 may open in any direction, for example, a vertically upward, vertically downward, or horizontal direction. To simplify the description, hereinafter the direction in which the opening 11 opens (upper side in FIG. 1) and the opposite direction (lower side in FIG. 1) may be referred to as above and below, respectively.

The vent member 2 includes a support body 3 fitted into the opening 11, a waterproof gas-permeable membrane 4 supported by the support body 3, and a cover 5 that covers the waterproof gas-permeable membrane 4. The support body 3 is provided with a vent passage 30 passing through the support body 3. The vent passage 30 opens into the interior space 10A of the housing 10 and is closed from above by the waterproof gas-permeable membrane 4. The above-mentioned seal member 6 seals the gap between the housing 10 and the support body 3 around the vent passage 30.

The structure and material of the waterproof gas-permeable membrane 4 are not particularly limited as long as it is a membrane (such as a woven fabric, a nonwoven fabric, a mesh or a net made of resin or metal) that allows gas to pass therethrough but prevents liquid from passing therethrough. For example, the waterproof gas-permeable membrane 4 may have a structure including a porous resin membrane and a reinforcing layer laminated thereto. A high-strength waterproof gas-permeable membrane 4 can be obtained by the addition of the reinforcing layer.

As a material for the porous resin membrane, a porous fluororesin material or a porous polyolefin material that can be produced by a known method such as stretching or extraction can be used. Examples of fluororesins include PTFE (polytetrafluoroethylene), polychlorotrifluoroethylene, tetrafluoroethylene-hexafluoropropylene copolymer, and tetrafluoroethylene-ethylene copolymer. Examples of monomers forming polyolefins include ethylene, propylene, and 4-methylpentene-1,1butene. A polyolefin obtained by polymerizing these monomers alone or copolymerizing these monomers can be used. A porous nanofiber film material or the like using polyacrylonitrile, nylon, or polylactic acid can also be used. Above all, a porous PTFE material is preferred because it can ensure gas permeability even with a small area and is highly capable of preventing foreign substances from entering the interior of the housing.

The porous resin membrane may be subjected to a liquid-repellent treatment depending on the environment in which the housing 10 is used. The liquid-repellent treatment can be carried out by applying a material having a low surface tension onto the porous resin membrane, followed by drying and then curing. A liquid-repellent agent capable of forming a coating film having a lower surface tension than that of the porous resin membrane, for example, a liquid-repellent agent containing a polymer having a perfluoroalkyl group, can be suitably used for the liquid-repellent treatment. The liquid repellent agent can be applied by impregnation, spraying, etc. In terms of ensuring sufficient waterproofness, it is desirable that the average pore size of the porous resin membrane be 0.01 μm or more and 10 μm or less.

It is preferable to use, for the reinforcing layer, a material having higher gas permeability than the porous resin membrane. Specifically, a woven fabric, a nonwoven fabric, a mesh, a net, a sponge, a foam, a porous material, etc. made of resin or metal can be used. The porous resin membrane and the reinforcing layer can be bonded to each other by a method such as adhesive lamination, heat lamination, heat welding, ultrasonic welding, or by the use of an adhesive.

The thickness of the waterproof gas-permeable membrane 4 may be adjusted, for example, in the range of 1 μm to 5 mm, in view of the strength and ease of fixing to the support body 3. The gas permeability of the porous resin membrane or the waterproof gas-permeable membrane 4 is preferably 0.1 to 300 sec/100 mL in terms of Gurley value.

The support body 3 has a flat disc-shaped base portion 31 provided with a through-hole at the center thereof and a tubular stem portion 32 having an interior space in communication with the through-hole of the base portion 31. That is, the through-hole of the base portion 31 and the interior space of the stem portion 32 constitute the above-mentioned vent passage 30. In the present embodiment, the diameter of the through-hole of the base portion 31 is set equal to the inner diameter of the stem portion 32, and their inner peripheral surfaces form a continuous wall. The structure of the base portion 31 is not limited to this. For example, the base portion 31 may be provided with a plurality of through-holes within a region surrounded by the stem portion 32.

The base portion 31 extends around the opening 11 so as to face the surface of the housing 10 outside the opening 11. The waterproof gas-permeable membrane 4 is bonded to the upper surface of the base portion 31. Furthermore, the upper surface of the base portion 31 is provided with a plurality of (three in the example shown in the diagrams) partitions 35 that are spaced from each other in the circumferential direction so as to surround the waterproof gas-permeable membrane 4. In the present embodiment, each of the partitions 35 has a circular arc shape to conform to the contour of the waterproof gas-permeable membrane 4.

The stem portion 32 extends from the lower surface of the base portion 31 and is engaged with the inside surface of the housing 10 through the opening 11. Specifically, a plurality of (three in the example shown in the diagrams) radially elastically deformable engaging portions are formed on the stem portion 32 by making a plurality of cuts in the lower part of the stem portion 32 from the lower end thereof. The lower end of each of these engaging portions is provided with an engaging hook 33 protruding radially outwardly.

The stem portion 32 is fitted with the above-mentioned seal member 6. The seal member 6 has, in its natural state, an outer diameter larger than the smallest diameter of the tapered surface 12 and smaller than the largest diameter thereof. As the seal member 6, an O-ring, a gasket, or the like can be used.

Furthermore, the support body 3 is provided with a pressing portion 34 at the corner formed by the base portion 31 and the stem portion 32. The pressing portion 34 has a ring shape surrounding the base of the stem portion 32, and presses the seal member 6 against the tapered surface 12 in the opening 11. Preferably, the bottom surface (pressing surface) of the pressing portion 34 in contact with the seal member 6 is located closer to the interior space 10A than the surface of the housing 10, in an assembly shown in FIG. 1.

The cover 5 has a main wall 51 disposed in contact with the partitions 35 of the support body 3 and facing the waterproof gas-permeable membrane 4 and a plurality of (three in the example shown in the diagrams) hanging walls 52 hanging from the outer edge of the main wall 51. In the present embodiment, the diameter of the main wall 51 is set equal to the outer diameter of the base portion 31 of the support body 3. That is, the hanging walls 52 are arranged to form a double circle with the partitions 35.

Each of the hanging walls 52 has a circular arc shape along the outer edge of the main wall 51. In addition, each of the hanging walls 52 covers the space between the partitions 35 at a position spaced radially outwardly from the partitions 35 so as to hide the waterproof gas-permeable membrane 4 from the exterior space 10B. In other words, the hanging walls 52 and the partitions 35 form a labyrinth around the waterproof gas-permeable membrane 4 to prevent the waterproof gas-permeable membrane 4 from being directly exposed to the outside.

The height of each of the hanging walls 52 is set higher than that of the partition 35. On the other hand, recessed portions 31a opening radially outwardly, into which the hanging walls 52 can be fitted, are provided at positions corresponding to the hanging walls 52 on the upper surface of the base portion 31. Projections and recesses are formed on the lower end of the hanging wall 52 and in the recessed portion 31a so that they can be engaged with each other, although not shown in the diagrams, and their engagement allows the cover 5 to be joined to the support body 3.

In the vent structure 1A described so far, the seal member 6 is disposed inside the opening 11, which makes it possible to prevent direct exposure of the seal member 6 to water, oil, etc. from outside.

In addition, in the present embodiment, the partitions 35 of the support body 3 and the hanging walls 52 of the cover 5 prevent the waterproof gas-permeable membrane 4 from being directly exposed to the outside. Therefore, the waterproof gas-permeable membrane 4 is never subjected to, for example, a direct high-pressure water jet, which makes it possible to prevent damage of the waterproof gas-permeable membrane 4.

Moreover, since the vent member 2 is structured so that even if water enters the cover 5, the water is smoothly discharged therefrom, this structure makes it possible to prevent the water from remaining undischarged on the waterproof gas-permeable membrane 4, no matter what direction the opening 11 opens.

<Modification>

Figure 4:
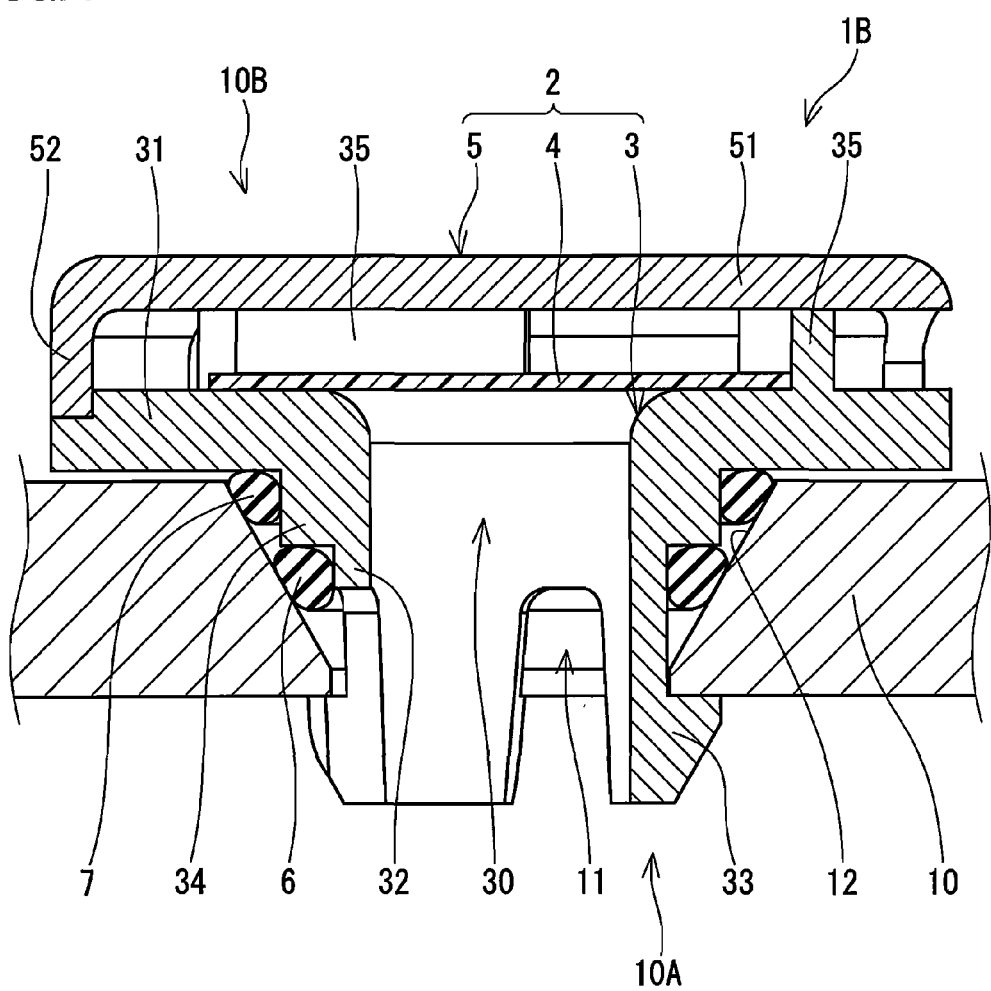
FIG. 4 is a longitudinal sectional view of a vent structure according to a modification of the first embodiment.

In the embodiment described above, only one seal member 6 is used, but a second seal member 7 also can be used, like a modified vent structure 1B shown in FIG. 4. In the example shown in this diagram, the second seal member 7 is fitted to the pressing portion 34 and pressed against the tapered surface 12 of the housing 10 by the base portion 31. It should be noted that the second seal member 7 may be pressed against the surface of the housing 10.

Also with this configuration, the seal member 6 can be protected from water, oil, etc. from outside. In addition, with the use of the second seal member 7, the waterproofness can be ensured for a long period of time, even if the housing 10 is corroded by salt.

Second Embodiment

Figure 5:
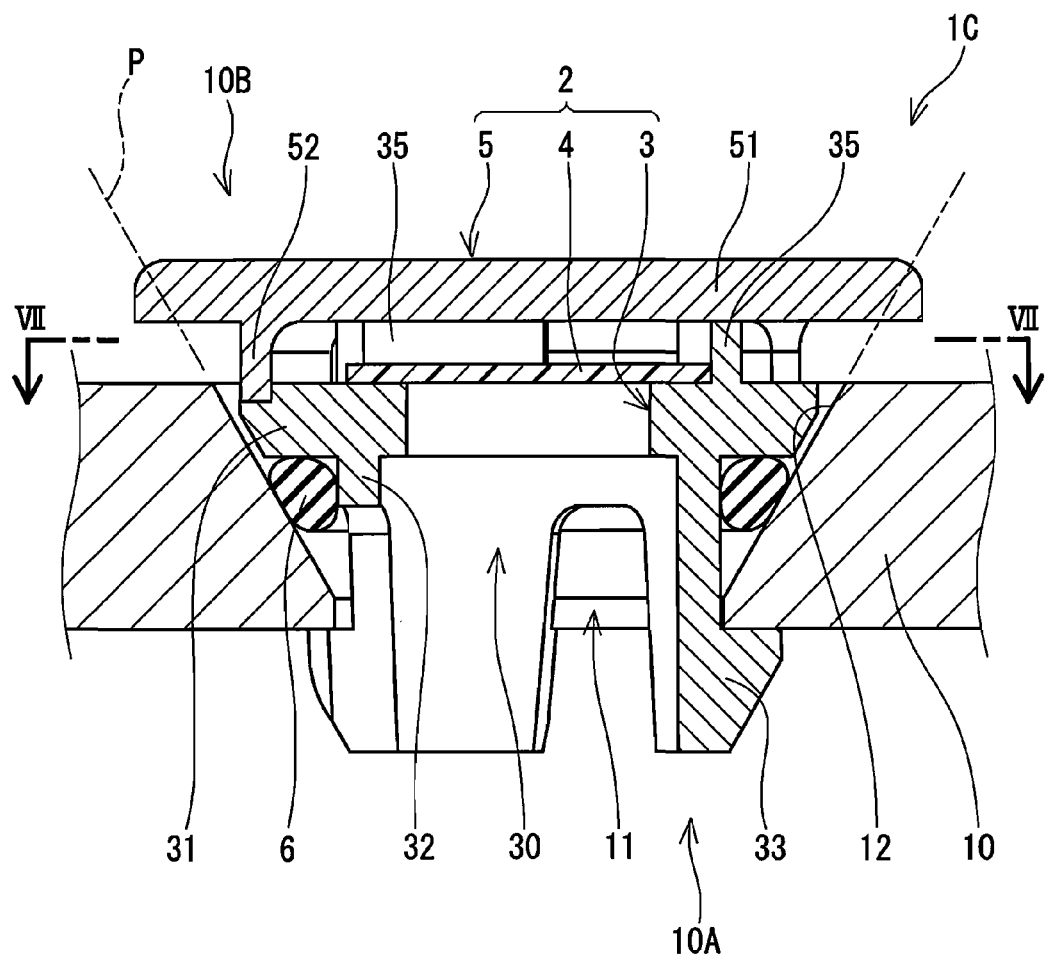
FIG. 5 is a longitudinal sectional view of a vent structure according to a second embodiment of the present invention.
Figure 6:
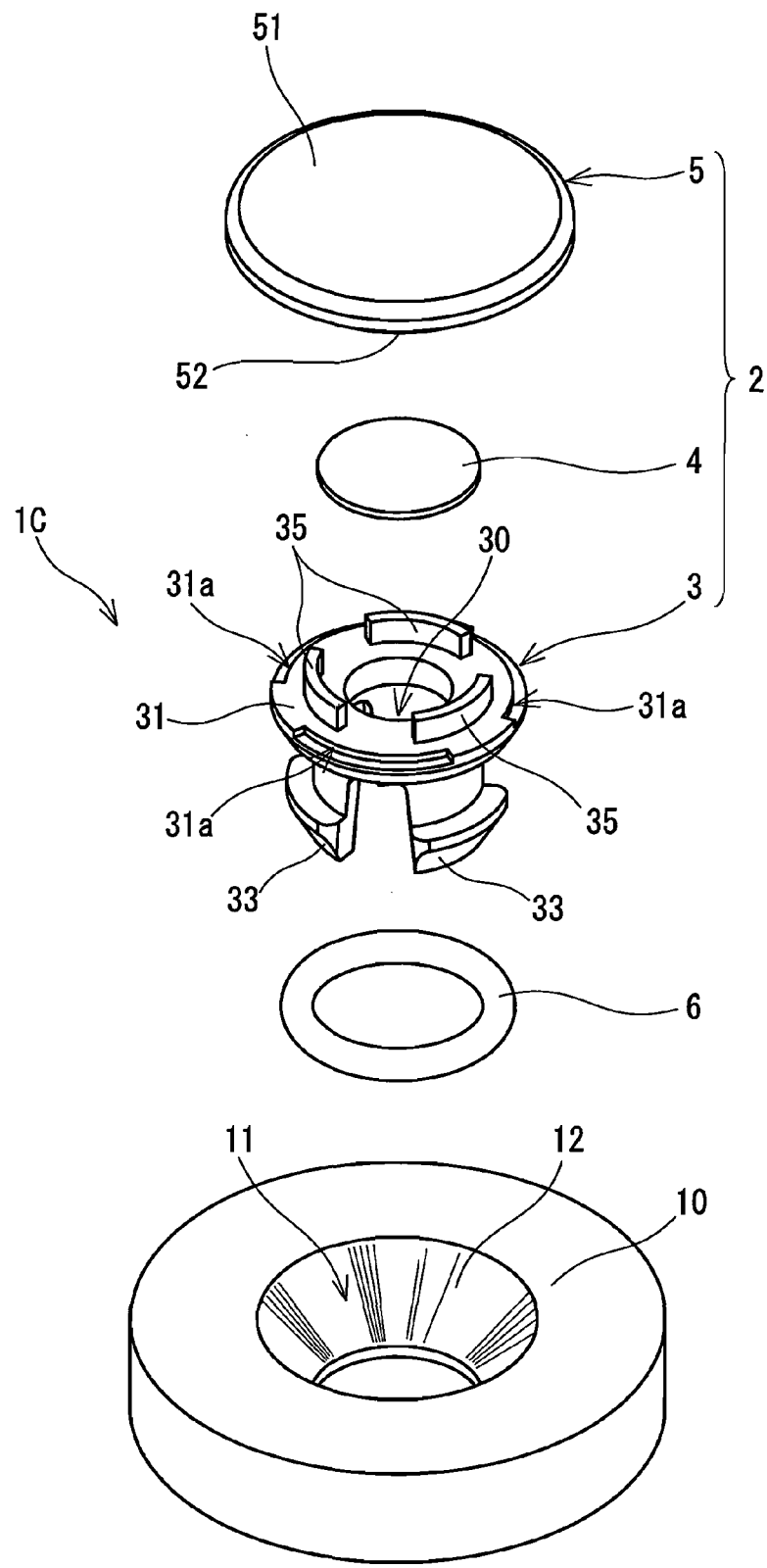
FIG. 6 is an exploded perspective view of the vent structure shown in FIG. 5.
Figure 7:
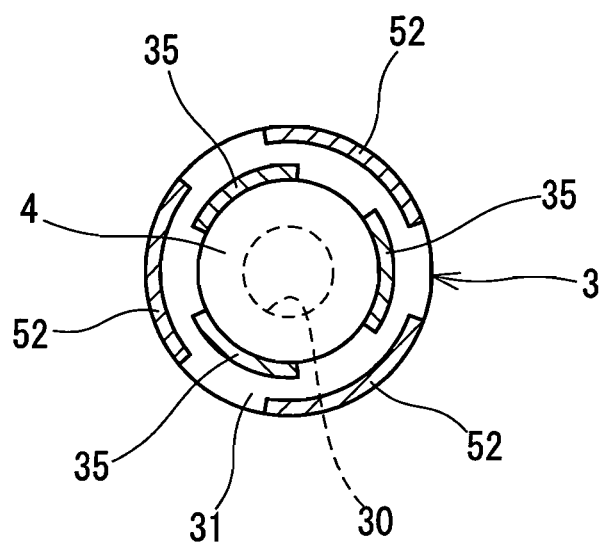
FIG. 7 is a transverse sectional view taken along the line VII-VII of FIG. 5.
Figure 8:
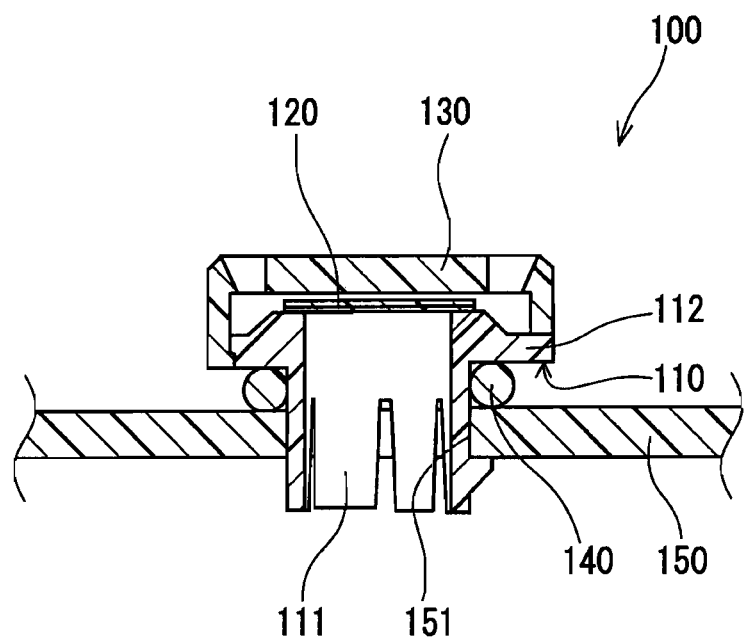
FIG. 8 is a sectional view of a conventional vent member.

Next, a vent structure 1C according to a second embodiment of the present invention will be described with reference to FIGS. 5 to 7. In the present embodiment, the same reference numerals are used to designate the same or similar parts as in the first embodiment, and the description thereof may be omitted.

In the vent structure 1C of the present embodiment, the base portion 31 is disposed inside the opening 11 so that the upper surface (the surface to which the waterproof gas-permeable membrane 4 is bonded) of the base portion 31 of the support body 3 is located in the same plane as the surface of the housing 10. A flange portion of the base portion 31 projecting around the stem portion 32 constitutes the pressing portion 34. It should be noted that "the upper surface of the base portion 31 being located in the same plane as the surface of the hosing 10" is a concept including not only the case where these surfaces are on exactly the same level but also the case where the difference between their levels is very small (for example, as small as the thickness of the waterproof gas-permeable membrane 4).

Furthermore, in the present embodiment, the hanging walls 52 of the cover 5 hang not from the outer edge of the main wall 51 but from a position slightly inside the outer edge of the main wall 51. In addition, the cover 5 has such a size that its outer edge intersects a virtual conical surface P extending from the tapered surface 12. That is, the diameter of the main wall 51 is set larger than the largest diameter of the tapered surface 12, and the diameter of a circle formed by the lateral surfaces of the hanging walls 52 is set smaller than the largest diameter of the tapered surface 12.

Also with the configuration of the present embodiment, the same effects as in the first embodiment can be obtained. In addition, with the use of the base portion 31 disposed inside the opening 11 as in the present embodiment, the size of the vent member 2 can be reduced. Furthermore, in the present embodiment, the upper surface of the base portion 31, which is the surface to which the waterproof gas-permeable membrane 4 is bonded, is in the same plane as the surface of the housing 10. Therefore, the height of a portion of the vent member 2 projecting from the surface of the housing 10 can be reduced. As a result, when the vent member 2 and other components are mounted in a limited space, the space can be efficiently used and design flexibility is increased.

The invention claimed is:

1. A vent structure comprising:
   a housing provided with an opening having a tapered surface whose diameter increases from an interior space of the housing toward an exterior space thereof;
   a vent member including: a support body fitted into the opening and having a vent passage opening into the internal space; a waterproof gas-permeable membrane that closes the vent passage; and a cover that covers the waterproof gas-permeable membrane; and
   a seal member that seals a gap between the housing and the support body around the vent passage,
   wherein the support body is provided with a through-hole constituting the vent passage, and has: a base portion to which the waterproof gas-permeable membrane is bonded; a tubular stem portion fitted with the seal member and extending from the base portion so as to be engaged with an inside surface of the housing; and a pressing portion that presses the seal member against the tapered surface in the opening.

2. The vent structure according to claim 1, wherein
   the support body has a plurality of partitions that are spaced from each other in a circumferential direction so as to surround the waterproof gas-permeable membrane, and
   the cover has: a main wall disposed in contact with the plurality of partitions and facing the waterproof gas-permeable membrane; and a plurality of hanging walls each covering a space between the partitions at a position spaced radially outwardly from the partitions so as to hide the waterproof gas-permeable membrane from the exterior space.

3. The vent structure according to claim 1, wherein
   the base portion extends around the opening so as to face a surface of the housing outside the opening, and
   the pressing portion is disposed at a corner formed by the base portion and the stem portion.

4. The vent structure according to claim 3, further comprising a second seal member fitted to the pressing member and pressed against the housing by the base portion.

5. The vent structure according to claim 1, wherein
   the base portion is disposed inside the opening so that its surface to which the waterproof gas-permeable membrane is bonded is located in the same plane as a surface of the housing, and
   the pressing portion is a flange portion of the base portion projecting around the stem portion.

6. The vent structure according to claim 5, wherein
the tapered surface is connected to the surface of the housing, and
the cover has such a size that its outer edge intersects a virtual conical surface extending from the tapered surface.

* * * * *